Sept. 8, 1964 D. L. KENDALL 3,148,094

METHOD OF PRODUCING JUNCTIONS BY A RELOCATION PROCESS

Filed March 13, 1961

INVENTOR
Don L. Kendall

BY Stevens, Davis, Miller & Mosher
ATTORNEYS

United States Patent Office 3,148,094

Patented Sept. 8, 1964

3,148,094

METHOD OF PRODUCING JUNCTIONS BY A RELOCATION PROCESS

Don L. Kendall, Richardson, Tex., assignor to Texas Instruments Incorporated, Dallas, Tex., a corporation of Delaware Filed Mar. 13, 1961, Ser. No. 95,425
5 Claims. (Cl. 148—175)

Figure 1:
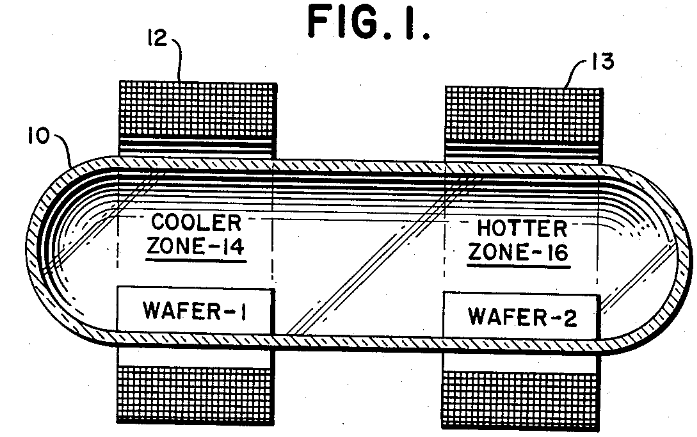

This invention relates to an improved technique for making semiconductor devices. More particularly it relates to improved methods of building up distinct layers of single crystal semiconductor material on suitably prepared semiconductors and to the products resulting from such methods.

Semiconductor materials have become increasingly important in the field of electronics because of their usefulness in fabricating semiconductor and thermoelectric devices among others.

In the past the usual semiconductor materials for fabricating devices were crystals of certain elements contained in Group IV of the periodic table of elements; specifically, germanium and silicon were used. As could be anticipated, germanium and silicon had certain undesirable limitations which demanded that new and better materials and techniques for fabricating semiconductor devices be sought.

Silicon devices were somewhat limited in frequency response, but would operate at temperatures up to 200° C., whereas germanium devices which had relatively good frequency response could not operate above about 85° C.

In the search of other semiconductor materials, investigators discovered that some binary and ternary compounds exhibited semiconductor properties. Some of these so-called compound semiconductors, in particular the compound semiconductors which contain one element from Group III and one element from Group V, have been disclosed, i.e., U.S. Patent 2,798,989, issued to Welker, relates that Group III-V compounds exhibit semiconductor properies.

Some Group III-V compound semiconductor materials are expected to provide high frequency operation at temperatures up to 400° C. for devices fabricated from such materials. Gallium arsenide is believed to be one of the best compound semiconductor materials which possess the requisite characteristics desirable in semiconductor devices.

Despite the inherent advantages of gallium arsenide and others of the compound semiconductors, certain difficulties have prevented their use in semiconductor devices to any important degree. Among these are the difficulties of producing a material of the requisite purity required for starting material for devices, and the difficulties of adding required amounts of significant impurities or "dopes" to the pure material to produce the p-type and n-type, regions required in useful devices. The significant p-type impurities and the significant n-type impurities commonly used with the Group IV semiconductor materials of silicon and germanium are relatively easy to control in the various growing, alloying, and diffusion processes used in the fabrication of devices based on Group IV semiconductors. This is not necessarily the case when attempts are made to dope III-V compound semiconductors in a similar fashion, for example, by introduction of significant amounts of a Group II or Group VI impurity in the III-V semiconductor. It has, therefore, been found to be quite difficult to produce reproducible III-V devices, possibly because of a combination of factors including the relatively high vapor pressure of one of the elements constituting the III-V semiconductor, the difficulty of obtaining sufficiently pure starting materials, the necessity for duplicable surfaces and the like.

The present invention makes it possible to overcome some of the inherent difficulties in utilizing Group III-V compound semiconductor materials to fabricate devices. For instance, it is possible utilizing the present invention to deposit an n-type material on a p-type material forming a single crystal material with a distinct p-region and n-region having controlled impurity concentrations. Currently, diffusion techniques to convert part of a single crystal exhibiting one type conductivity into an opposite-type conductivity result in poor control of the concentration gradient.

Furthermore, various characteristics of a semiconductor material such as energy gap, lifetime of minority carriers and electron or "carrier" mobility greatly effect the usefulness of a device made from that material. Because of this fact, it would be desirable if various properties of semiconductor materials could be combined. For example, it would be desirable in solar cells to have various layers of semiconductor materials with different energy gaps. Likewise, germanium transistors provided an emitter region of a higher energy gap than the base region would exhibit better emitter efficiency.

The present invention provides means for utilizing desirable properties of both Group IV semiconductor materials and Group III-V compound semiconductor materials. Moreover, by techniques of the present invention control of conductivity-affecting impurities can be readily achieved.

Therefore, one object of this invention is to provide a method for building up novel semiconductor devices with reproducible properties.

Another object of the invention is to provide a method for building up single crystal semiconductor material.

Still another object is to provide a method for introducing doping impurities into a semiconductor material in a manner which permits the production of controllable concentration gradients in the same.

Still a further object is to provide layered structures comprised of semiconductors with different properties, while permitting the material of each layer to retain its own identity and consequently to retain its own useful properties.

Another further object is to provide a method for building up single crystal structures wherein the surface of the substrate is refreshed by interchanging the cooler and hotter regions.

Finally, it is a further object of the invention to provide a method of forming layered bodies, PN junctions and novel semiconductor bodies by methods permitting greater flexibility and which are adapted to the formation of unique crystal structures from which an almost endless variety of devices may be fabricated.

Briefly, in accordance with the present invention, a controllable heating means is disposed about a vessel in which there are confined, or into which there may be introduced at appropriate times one or more bodies comprising the semiconductor onto which the additional semiconductor material is to be deposited to form the desired compound product and additional semiconductor material. Further, the vessel is constructed so that any desired atmosphere or vacuum may be maintained therein. The controls provided for the heating means are such that there will exist in the vessel a relatively hotter region and a relatively cooler region. By maintaining each of these regions at temperatures which are appropriate for the materials being used, it becomes feasible to build up laminated devices which may include one or more PN junctions. Moreover, the cooler and hotter regions are interchanged thus providing an additional advantage to processing as hereinafter mentioned.

Figure 2:
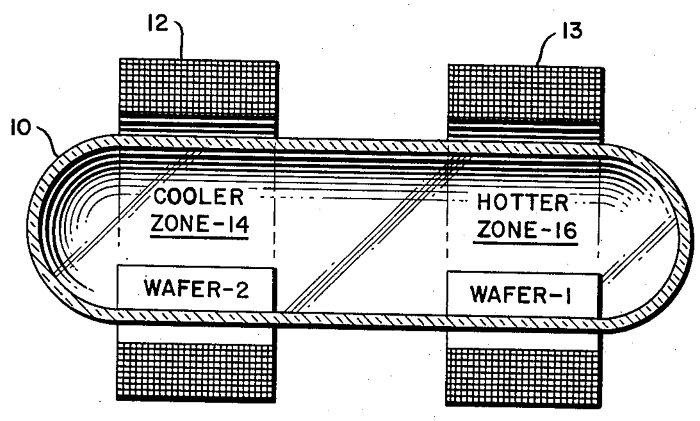

In the drawings:

FIGURE 1 is a schematic view of illustrating the apparatus for practicing the invention and the first step of the method; and FIGURE 2 is a similar schematic view illustrating the second step of the method.

The drawing and the following description disclose the best mode for carrying out the invention. The description also states a specific preferred embodiment for carrying out the invention. The confining vessel shown in FIGURES 1 and 2 preferably consists of a quartz tube or ampule 10 wherein there is disposed at one end a wafer 1 of single crystal semiconductor material and at the other end wafer 2 of the same or different single crystal semiconductor material. Heating coils 12 and 13 are provided for maintaining one end region 14 of ampule 10 at any operating temperature ($T_1$) and another region 16 of the ampule at some other higher temperature ($T_2$). For purposes of illustration $T_2$ will be assumed to be at least 25° C. greater than $T_1$; although the differential could be less than 1° C. Tube 10 is originally sealed at one end and left open at the other end to permit the flushing of tube 10 with an inert or inactive gas or vapor and subsequent charging of the tube with wafer 1 and wafer 2. The open end of the tube may be sealed as shown in the drawing or it may be provided with a valved closure through which any desired atmosphere may be introduced, or through which the quartz vessel 10 may be evacuated to any desired extent.

When the materials of wafers 1 and 2 are suitably chosen and the heating means 12 and 13 are actuated to produce the desired temperatures, $T_1$ and $T_2$, material will transfer by a relocation process from the hotter zone to the cooler zone. Conventionally, a carrier medium enters into the relocation process and thus, one is present in the tube 10.

In the first step of the process, wafer 2, for example GaAs, is placed in the hot zone 16, maintained for example at between 800° C. and 1000° C. while the wafer 1, for example GaAs, is placed in the cooler zone 14, maintained at approximately 700° C. Material will migrate from the surface of wafer 2 and deposit on the surface of wafer 1. As a result, a fresh, new surface will be created on wafer 2 with the removal (by relocation) of the original surface layer.

After the new surface is formed on wafer 2, the heating means 12 and 13 are adjusted so that the region surrounding wafer 2 is maintained at about 700° C. and the region around wafer 1 is held at between 800° C. and 1000° C. Alternatively, the two wafers may be interchanged in the furnace as shown in the drawings. In either event, material now leaves the surface of wafer 1 and deposits in a continuation of the single crystal form on the fresh surface of wafer 2. Although the explanation for the relocation process is not fully understood, it has been found that the material deposits epitaxially best—builds up as single crystal material of the same crystal orientation as the parent material—when deposited on a fresh, new surface prepared as described than when deposited on a surface which has not been refreshed as aforementioned. Although it is not absolutely necessary to form the refreshed surface in the epitaxial growth process, the crystal structure appears more uniform with less flaws when the substrate contains the fresh, new surface described heretofore.

In the process described, it is essential that the material which is transported from the hotter region and deposited on the material in the cooler region is one having approximately the same unit cell size as the crystalline material on which it deposits.

Actually, the permissible degree of difference in cell sizes between the substrate and the epitaxially deposited material depends upon the strain the crystals of the material can withstand. In other words, as long as the yield strength at the interface of either material is not exceeded such that crystal fracturing will occur, any material may be epitaxially deposited on another material. Most of the semiconductor materials which would be of interest to epitaxially deposit on another have such cell sizes that the crystal strain of the material would never be exceeded. Thus, for example, the unit cell size of gallium arsenide is 5.656 angstroms and it may be epitaxially deposited on germanium which has a unit cell size of 5.657 angstroms.

Aluminum phosphide, gallium phosphide and silicon have unit cell sizes from about 5.42 A. to 5.44 A. The following table illustrates several combinations of semiconductor material suitable for use in the practice of the present invention.

| Deposit [1] (wafer 1) | Substrate [1] (wafer 2) |
|---|---|
| GaAs | GaAs |
| GaAs | Ge |
| AlP | Si |
| GaP | Si |

[1] The materials used may be dope to n or p type, or undoped, as the case may be.

In such systems the materials are usually, though not necessarily, chosen to yield deposits of n- or p-type material on a substrate of p- or n-type material.

The atmosphere in the foregoing embodiment may be an inert carrier gas, for example Cl, a vacuum wherein the conductivity affecting impurities contained in the material to be epitaxially deposited on the substrate act as carriers or a conductivity affecting atmosphere (not a carrier) plus a carrier gas. In the case of gallium arsenide, typical active carrier atmospheres would be sulfur, selenium, tellurium, zinc, cadmium, etc.

The following are specific examples of procedures in accordance with the invention described above, and are to be considered as illustrative rather than as limitative.

*Example 1*

Slices of gallium arsenide were cut so that each had a surface area of about 1.5 cm.$^2$. These were both taken from n-type gallium arsenide crystals and had excess carrier concentrations of about $2\times10^{18}$ atoms per cc. and $10^{17}$ atoms per cc. respectively. The crystal above with $2\times10^{18}$ atoms per cc. was sulphur doped during growing whereas the other remained undoped. The slices were lapped with optical rouge (American Optical Co. 309W for example) on all faces and then polish etched with a dilute mixture of $HNO_3$, HCl, and HF in the proportions of 2:1:1 by volume. The samples were then sealed off in an evacuated quartz ampule 6½ inches long, and placed at opposite ends of the ampule. One crystal slice was held at 998° C. for less than one minute while the other crystal slice was at the cold end of the furnace at about 900° C. Following this, the ampule was inserted further into the tube furnace so that the second crystal slice was shifted into the hot part of the ampule, wherein the temperature was about 985° C. and the previously heated slice was shifted to a region in the ampule which was maintained at about 770° C.

This condition was maintained for 112 hours and then the system was cooled to 350° C. in 2½ hours and the ampule removed from the furnace and the two wafers were examined with the following result.

A p-type single crystal layer of GaAs was found to have formed on the cold sample at the expense of the hot sample. A p-type layer formed instead of an n-type layer apparently caused by loss of n-type impurities during the epitaxial growth. The thickness of this layer was about 5.3 microns as measured by angle lapping at 5° and observing the depth to the interface between the original crystal surface and the vapor grown layer.

This interface was indistinguishable in some areas, indicating that good crystalline contact existed between the layer and the parent crystal.

In the procedure described, instead of etching the surfaces of the semiconductor, they may be prepared for the treatment by optical polishing, or other suitable techniques.

*Example 2*

The above procedure was repeated except that the ampule length was 5.75 inches long and the preliminary heat treatment to clean up the surface of one wafer was at 800° C. for one hour and then the cleaned wafer was maintained at 727° C. for 70 hours, while the second wafer was maintained at 792° C. for the same time. Again, a single crystal layer was formed on the colder sample at the expense of the hotter sample.

In another aspect of the invention an inactive (inert carrier) atmosphere or active (conductivity affecting) atmosphere plus a carrier gas is provided in ample 10 whereby additional results may be obtained, compared with the evacuated procedure where the impurities in the transferring material were the relocation carriers.

Doping is feasible by utilizing a suitable impurity as the relocation carrier. Thus, sulfur, selenium, tellurium, zinc or cadmium may be used as the atmosphere through which a compound semiconductor such as gallium arsenide is transported from a hot zone and relocated onto a surface in a relatively cooler zone. Whether conducted in this fashion, that is, whether conducted with a suitable carrier or relocation atmosphere, or in an inert atmosphere, it will be seen that the procedure permits controlling the impurity concentration by varying or changing the ambient atmosphere.

To illustrate the above, the present invention enables a transistor to be fabricated of germanium for the base and collector regions, and a higher band gap material (gallium arsenside) to be vapor grown onto the base region as an emitter region. Thus, a device is produced having a better emitter efficiency than if all regions were composed of germanium. Further it is known that gallium arsenide has a short minority carrier lifetime and this fact requires transistors made of this material to have extremely narrow base widths. The procedure of the present invention makes it possible to produce extremely narrow base widths to close tolerances by suitably controlling the temperatures and times of the procedures. As a still further illustration, a plural layer or stacked solar cell arrangement has recently been discovered. The arrangement requires that the several layers be of different band gap materials and be arranged in band gap order. As is evident, this can be accomplished by the procedure of the invention, and the materials joined together retain their own identity, for example GaAs can be relocated onto germanium.

It is obvious from the previous description that P–N junctions are produced merely by appropriate selection of the material of the wafers or by the control of the relocation carrier atmosphere. For instance, if wafer 1 is p-type and wafer 2 is n-type a junction would result. Also, a p-type impurity can be chosen as the relocation carrier atmosphere when relocating onto an n-type wafer and vice versa. Further, the excess carrier concentration in the material deposited on wafer 2 can be controlled and/or varied in accordance with any program desired merely by controlling or varying the amount of the carrier in the tube 10 and its duration. It should also be apparent that the carrier can be changed as desired.

Although the present invention has been shown and described in terms of a preferred specific embodiment and the best mode for carrying out the invention, changes and modifications will occur to those skilled in the art which do not depart from the inventive concepts taught herein. Such are deemed to fall within the purview of the spirit of the invention.

What is claimed is:

1. The method of building up a crystalline material comprising the steps of locating a first semiconductor body selected from the group consisting of germanium, silicon and Group III-V compound semiconductors and a second semiconductor body selected from the group consisting of Group III-V compound semiconductors in an enclosure, said first body and said second body having at least similar unit cell sizes, evacuating said enclosure, heating said first and said second bodies in said enclosure to an elevated temperature sufficient to initiate a relocation process, establishing a temperature differential between said first body and said second body, maintaining said temperature differential for a period of time sufficient for material from the hotter body to relocate on the cooler body forming a crystal therewith.

2. The method of building up a crystalline material comprising the steps of locating a first semiconductor body selected from the group consisting of germanium, silicon and Group III-V compound semiconductors and a second semiconductor body selected from the group consisting of Group III-V compound semiconductors in an enclosure, said first body and said second body having at least similar unit cell sizes, introducing an active conductivity-affecting carrier atmosphere into said enclosure and maintaining said active conductivity-affecting carrier atmosphere therein, heating said first and said second bodies to an elevated temperature sufficient to initiate a relocation process, establishing a temperature differential between said first body and said second body, maintaining said temperature differential for a period of time sufficient for material from the hotter body to relocate on the cooler body forming a single crystal therewith.

3. The method of building up a crystalline semiconductor material comprising steps of locating a first semiconductor body selected from the group consisting of germanium, silicon and Group III-V compound semiconductors and a second semiconductor body selected from the group consisting of Group III-V compound semiconductors in an enclosure, said first body and said second body having at least similar unit cell sizes, heating said first and said second bodies to an elevated temperature sufficient to initiate a relocation process, establishing a temperature differential between said first body and said second body, maintaining said temperature differential for a period of time sufficient for material from the hotter body to evolve therefrom leaving a refreshed surface on said hotter body, reversing said temperature differential between said first body and said second body, and maintaining said reversed temperature differential for a period of time sufficient to relocate material from the now hotter body on the refreshed surface of the now cooler body.

4. The method as set forth in claim 3 and wherein a carrier atmosphere is introduced into said enclosure and said carrier atmosphere is maintained within said enclosure during said heating steps.

5. The method of building up a crystalline material comprising the steps of locating a first semiconductor body selected from the group consisting of germanium, silicon and Group III-V compound semiconductors and a second semiconductor body selected from the group consisting of Group III-V compound semiconductors in an enclosure, said first body and said second body having at least similar unit cell sizes, introducing a nonconductivity-affecting carrier atmosphere within said enclosure and maintaining said nonconductivity-affecting atmosphere within said enclosure, heating said first and said second bodies to an elevated temperature sufficient to initiate a relocation process, establishing a temperature differential between said first body and said second body, maintaining said temperature differential for a period of time sufficient for material from the hotter body to relocate on the cooler body forming a single crystal therewith.

References Cited in the file of this patent

UNITED STATES PATENTS

| | | |
|---|---|---|
| 2,763,581 | Freedman | Sept. 18, 1956 |
| 2,798,989 | Welker | July 9, 1957 |
| 2,834,697 | Smits | May 13, 1958 |
| 2,842,468 | Brenner | July 8, 1958 |
| 2,846,340 | Jenny | Aug. 5, 1958 |
| 2,847,335 | Gremmelmaier et al. | Aug. 12, 1958 |
| 2,890,939 | Ravich | June 16, 1959 |
| 2,898,248 | Silvey | Aug. 4, 1959 |
| 2,900,286 | Goldstein | Aug. 18, 1959 |
| 2,929,859 | Loferski | Mar. 22, 1960 |
| 3,070,467 | Fuller et al. | Dec. 25, 1962 |
| 3,096,219 | Nelson | July 2, 1963 |

FOREIGN PATENTS

| | | |
|---|---|---|
| 1,184,921 | France | Feb. 9, 1959 |
| 1,193,194 | France | Apr. 27, 1959 |

OTHER REFERENCES

Schillmann: 2 Naturforschg. 11a, pp. 463–72 (1956).

I.B.M. Technical Disclosure Bulletin, vol. 3, No. 4, September 1960, pp. 32 and 33.

I.B.M. Journal of Research and Development, vol. 4, No. 3, July 1960, pp. 283–287 and pp. 288–295.